United States Patent [19]

Hager et al.

[11] Patent Number: 5,126,803
[45] Date of Patent: Jun. 30, 1992

[54] BROADBAND QUANTUM WELL LED

[75] Inventors: Harold E. Hager, Bellevue; Joseph L. Mantz, Issaquah, both of Wash.

[73] Assignee: The Boeing Company, Seattle, Wash.

[21] Appl. No.: 667,442

[22] Filed: Mar. 11, 1991

[51] Int. Cl.$^5$ ............................................. H01L 33/00
[52] U.S. Cl. ........................................ 357/17; 357/16; 357/4; 357/55; 357/68; 372/46; 372/43; 372/45; 372/48
[58] Field of Search .................. 357/17, 16, 4, 68, 55; 372/46, 43, 45, 48

[56] References Cited

U.S. PATENT DOCUMENTS

| | | | |
|---|---|---|---|
| 4,148,045 | 4/1979 | Fang et al. | 357/17 |
| 4,211,586 | 7/1980 | Fang et al. | 148/175 |
| 4,577,207 | 3/1986 | Copeland | 357/17 |
| 4,577,321 | 3/1986 | Carney et al. | 372/50 |
| 4,627,065 | 12/1986 | Logan et al. | 372/50 |
| 4,637,122 | 1/1987 | Carney et al. | 29/569 |
| 4,700,353 | 10/1987 | Van Gieson et al. | 372/26 |
| 4,720,834 | 1/1988 | Yamamoto et al. | 372/48 X |
| 4,730,331 | 3/1988 | Burnham et al. | 372/50 |
| 4,740,978 | 4/1988 | Göbel | 372/50 |
| 4,751,710 | 6/1988 | Yamaguchi et al. | 372/44 X |
| 4,773,076 | 9/1988 | Yamamoto et al. | 372/48 X |
| 4,788,689 | 11/1988 | Tokuda et al. | 372/45 |
| 4,802,182 | 1/1989 | Thornton et al. | 372/46 X |
| 4,817,103 | 3/1989 | Holonyak, Jr. et al. | 372/45 |
| 4,817,110 | 3/1989 | Tokuda et al. | 372/45 |
| 4,894,833 | 1/1990 | Carlin | 372/44 |
| 4,899,359 | 2/1990 | Yano et al. | 372/48 X |
| 5,033,053 | 7/1991 | Shimizu et al. | 372/46 X |

FOREIGN PATENT DOCUMENTS 0174635 3/1986 European Pat. Off. .......... 372/46 X

OTHER PUBLICATIONS

Hsieh et al, "Liquid-Phase Epitaxy Grown PbSnTe Distributed Feedback Laser Diodes with Broad Continuous Single-Mode Tuning Range," *IEEE Journal of Quantum Electronics*, vol. QE-16, No. 10, Oct. 1980, pp. 1039-1044.

K. Berthold et al., "Bias-Controlled Intersubband Wavelength Switching in a GaAs/AlGaAs Quantum Well Laser", *Applied Physics Letter*, vol. 55, No. 2, Oct. 2, 1989, pp. 1382-1384.

S. Ikeda et al., "Asymmetric Dual Quantum Well Laser-Wavelength Switching Controlled By Injection Current," *Applied Physics Letter*, vol. 55, No. 12, Sep. 18, 1989, pp. 1155-1157.

S. Ideda et al., "Wide-Range Wavelength Tuning of an Asymmetric Dual Quantum Well Laser With Inhomogeneous Current Injection," *Applied Physics Letter*, vol. 55, No. 20, Nov. 13, 1989, pp. 2057-2059.

N. Patel, "Narrow Strip Graded Barrier Single Quantum Well Lasers—Threshold Current Considerations," *IEEE Journal of Quantum Electronics*, vol. QE-23, No. 6, Jun. 1987, pp. 989-992.

U.S. Patent Application Ser. No. 07/437,645, Filed Nov. 16, 1989, for C. S. Hong et al., MULTIWAVELENGTH LED AND LASER DIODE OPTICAL SOURCE.

*Primary Examiner*—William Mintel
*Attorney, Agent, or Firm*—Christensin, O'Connor, Johnson & Kindness

[57] ABSTRACT

An LED having a broadband emission spectrum. In one embodiment, the LED comprises a layered semiconductor structure of length L, the structure including an active layer comprising multiple asymmetric quantum wells. A pair of stripe electrodes is formed on a surface of the structure, to thereby form at least one optical cavity having a pumped length less than L. Currents to the cavities are controlled as a function of temperature to produce broadband emission over a range of temperatures.

20 Claims, 12 Drawing Sheets

BROADBAND QUANTUM WELL LED

FIELD OF THE INVENTION

The present invention relates to light-emitting diodes, and provides a light-emitting diode having a relatively broadband emission spectrum over an extended temperature range.

BACKGROUND OF THE INVENTION

The development of a reliable, general purpose interface system for optical networks presents the most critical problem to be solved before many diverse fiber-optic sensors can be integrated into complex systems, for example, aircraft systems. Such an interface system must provide optical power, multiplexing, read-out, and signal processing functions for a wide variety of sensors.

A particularly promising fiber-optic sensor/network interface system is one based upon the use of wavelength division multiplexing (WDM). However, the development of a WDM system depends upon the development of a suitably broadband optical source. For many applications, for example in aircraft, the optical source must retain its broadband characteristics over a significant temperature range. The long life, small size, and high coupling efficiency of edge-emitting LEDs are ideal characteristics for the broadband source of a WDM-based sensor interface system. Unfortunately, the spectral widths of commercially available edge-emitting LEDs are much too narrow to meet the requirements of a WDM system. In particular, typical edge-emitting LEDs yield a full spectral width at half maximum (FWHM) of no more than about 30 nanometers. In comparison, the spectral width requirement for a WDM broadband source is on the order of 150 nanometers.

SUMMARY OF THE INVENTION

The present invention is based upon the discovery that a broadband, edge-emitting LED can be constructed by the use of an active layer comprising one or more quantum wells, in combination with an unpumped portion of the optical cavity formed in the active layer. The current to the LED is controlled as a function of temperature, such that the LED retains its broadband characteristics over a significant temperature range.

In one preferred embodiment, the LED comprises a layered semiconductor structure of length L, the structure including an active layer comprising first and second quantum well layers separated by a barrier layer. The band gap energies of the quantum wells differ from one another. A stripe electrode of length l less than L is formed on a first surface of the semiconductor structure, and a base electrode is formed on the opposite surface. The electrodes form at least one optical cavity of length L having a pumped region of length l. The pumped region length, and the confinement factor of the active layer, are selected such that the device operates as an LED, i.e., at all injection currents of interest, the device operates well below the laser threshold condition.

The upper surface of the semiconductor structure may include a pair of stripe electrodes parallel to one another, the stripe electrodes having lengths $l_1$ and $l_2$, both less than L. The stripe electrodes may be positioned side by side to form first and second optical cavities, or may be colinear so that they combine to form a single optical cavity. In either case, a control circuit provides currents to the stripe electrodes, and adjusts the currents as a function of temperature such that the LED output has a substantially constant bandwidth over an extended temperature range. Embodiments with alternative and multiple active layer designs are also disclosed.

DETAILED DESCRIPTION OF THE PREFERRED EMBODIMENT

Figure 1:
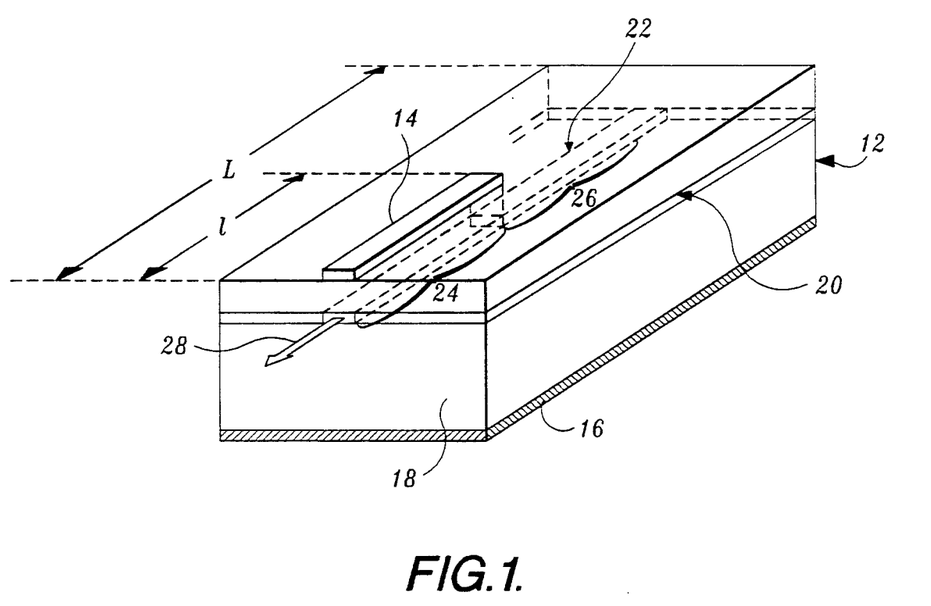
FIG. 1 is a schematic perspective view of an LED according to the present invention.
Figure 2:
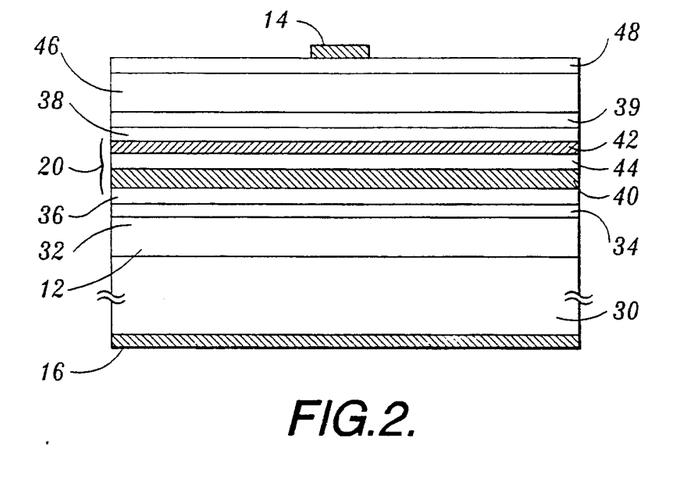
FIG. 2 shows a preferred embodiment for the epitaxial layer structure of the LED of FIG. 1.

FIGS. 1 and 2 illustrate a first preferred embodiment of an edge-emitting LED in accordance with the present invention. The LED comprises layered semiconductor structure 12 sandwiched between an upper stripe electrode 14 and base electrode 16. Structure 12 includes active layer 20 that comprises one or more quantum wells, as described in greater detail below. The length of structure 12 and of base electrode 16 along the direction of electrode 14 is L, while the length of the stripe electrode itself is l.

Flow of current between electrodes 14 and 16 results in the generation of light in optical cavity 22 that extends for the full length L of structure 12 within active layer 20. Optical cavity 22 includes a pumped section 24 of length l beneath electrode 14, and an unpumped section 26 of length L-l. Production of photons occurs almost exclusively in pumped region 24, because there is no significant current flow in unpumped section 26. The rear facet of semiconductor structure 12 may include a mirror or other reflecting means, such that the production of an output beam 28 occurs almost exclusively at front facet 18 of structure 12. As is well known to those skilled in the art, the length ratio l/L and the optical confinement factor of active layer 20 (and the surrounding layers) may be controlled such that the device operates well below the lasing threshold. This is particularly important for the present invention, because lasing would produce narrow emission lines, rather than the desired broadband emission.

FIG. 2 illustrates the makeup of structure 12 and active layer 20 in greater detail for a preferred embodiment of the invention. The structure comprises substrate 30, cladding layer 32, GRIN (graded index) layer 34, SCH (separate confinement heterostructure) layer 36, first and second quantum well layers 40 and 42 separated by barrier layer 44, second SCH layer 38, second GRIN layer 39, second cladding layer 46, and cap layer 48. The GRIN and SCH layers are referred to as confinement layers, since they provide for confinement of the light travelling along the active layer. The sizes and compositions of the active and confinement layers define the confinement factor of the active layer.

In general, each of quantum well layers 40 and 42 comprise a reduced band gap layer into which electrons and holes are injected from the adjacent higher band gap layers. The injected electrons and holes combine in the quantum well layers to produce light. In a quantum well layer, the thickness (e.g., 50-100 Angstroms) is sufficiently small such that electrons and holes display quantum size effects. Quantum well layers 40 and 42 are designed such that they have different band gaps, and the active layer 20 shown in FIG. 2 can therefore be described by the phrase "multiple asymmetric quantum wells." The difference in band gap is symbolized in FIG. 2 by different thicknesses for the quantum well layers. In general, band gap differences can be created either by variations in thickness and/or in composition. Barrier layer 44 has a higher band gap than either quantum well layer, and its function is to provide for charge transport between the quantum wells, but to limit the optical interaction between the wells, so that the wells do not lock to one another. Preferably, the barrier is adjusted such that the wells are weakly coupled optically.

The structure shown in FIG. 2 may be implemented in gallium arsenide, indium phosphide, and other known III-V semiconductor systems. In a gallium arsenide system, the compositions of the layers in one preferred embodiment are as follows:

TABLE 1

| Cap (48) | GaAs |
| Cladding (46) | p Al$_{0.5}$GaAs |
| GRIN (39) | p Al$_{.3-.5}$GaAs |
| SCH (38) | p Al$_{0.3}$GaAs |
| Quantum Well (42) | GaAs |
| Barrier (44) | p Al$_{.3}$GaAs |
| Quantum Well (40) | Al$_{.1}$GaAs |
| SCH (36) | p Al$_{0.3}$GaAs |
| GRIN (34) | Al$_{.5-.3}$GaAs |
| Cladding (32) | n Al$_{0.5}$GaAs |
| Substrate (30) | n GaAs |

The layers are grown epitaxially using conventional techniques. Quantum well layer 40 preferably has the higher energy band gap. The higher energy quantum well layer is preferably placed next to the source of free electrons, i.e., to the n-doped aluminum gallium arsenide cladding layer. This sequence minimizes the energy barrier for interwell transit, promoting a more even n-carrier current into both wells. The use of p-doping in the SCH and barrier layers minimizes the spatial variations of the hole concentration within the wells.

Figure 3A:
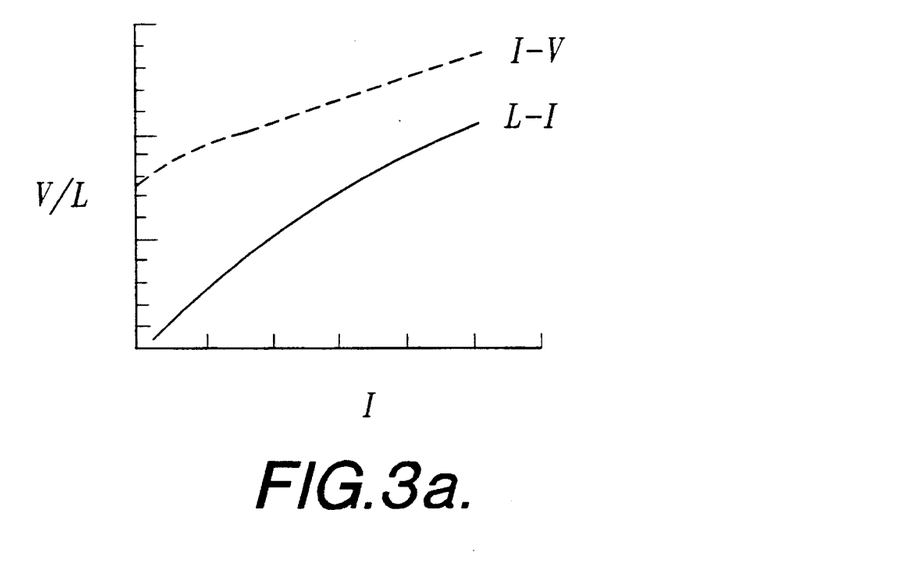
FIGS. 3a–3d are graphs illustrating the operation of the LED of FIGS. 1–2 for pumped/umpumped lengths of 50/200 microns.
Figure 3B:
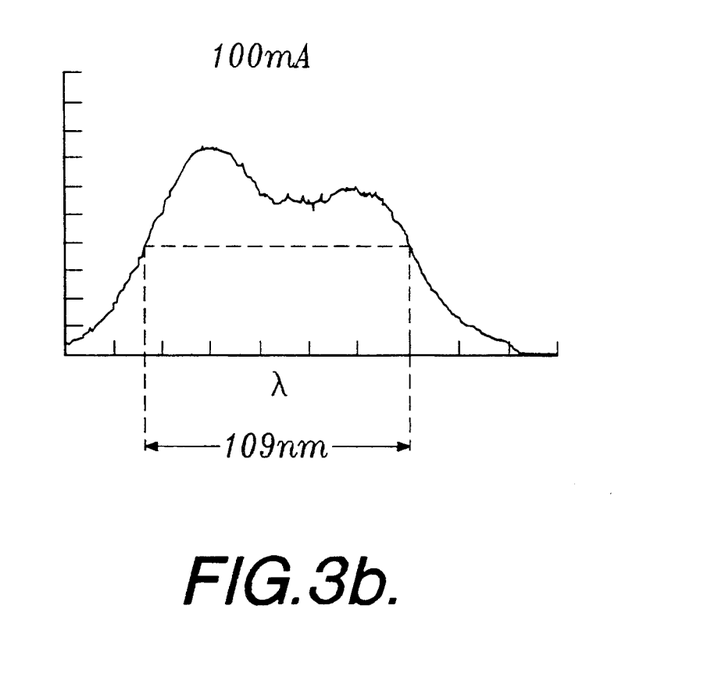
Figure 3C:
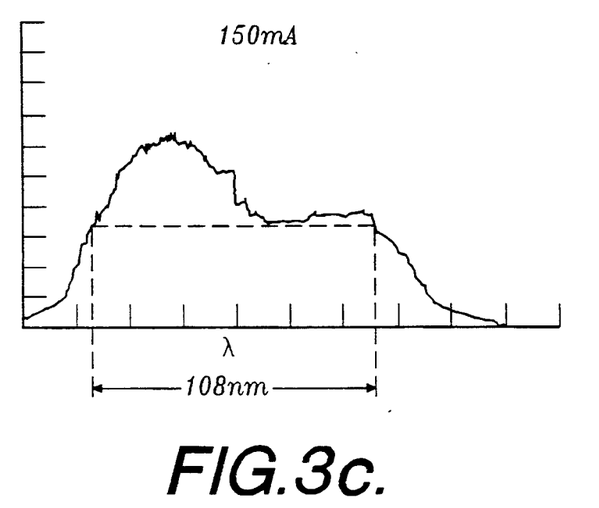
Figure 3D:
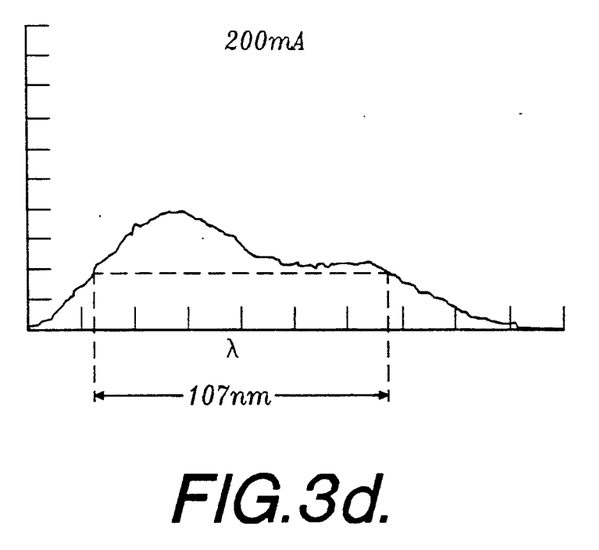

The material represented in Table 1 was processed into LEDs with truncated stripe electrodes, as shown in FIG. 1, with eight micron-wide cavities. A first LED was fabricated with a total cavity length L of 250 microns and a pumped cavity length l of 50 microns. The current-voltage (I-V) and the output optical power versus current (L-I) curves for this device are shown in FIG. 3a. The current scale is 0-300 mA, the voltage scale is 0-3 volts, and the output power scale is 0-3 milliwatts. FIGS. 3b-3d, illustrate the spectral characteristics of the LED of FIG. 3a, for injection currents of 100 mA, 150 mA, and 200 mA, respectively, with the wavelength scale in each case extending from 720-920 nanometers. In FIG. 3b, the full width at half maximum (FWHM) is 109 nanometers, an extremely large bandwidth for an LED. The FWHM values for FIGS. 3c and 3d are 108 and 107 nanometers, respectively. This data demonstrates the extremely large bandwidths that can be obtained by use of the multiple asymmetric quantum well structure, in connection with a relatively short pumped section of the optical cavity. In FIGS. 3b-3d, the double peak spectrum shape is maintained over a significant variation in the injection current.

Figure 4A:
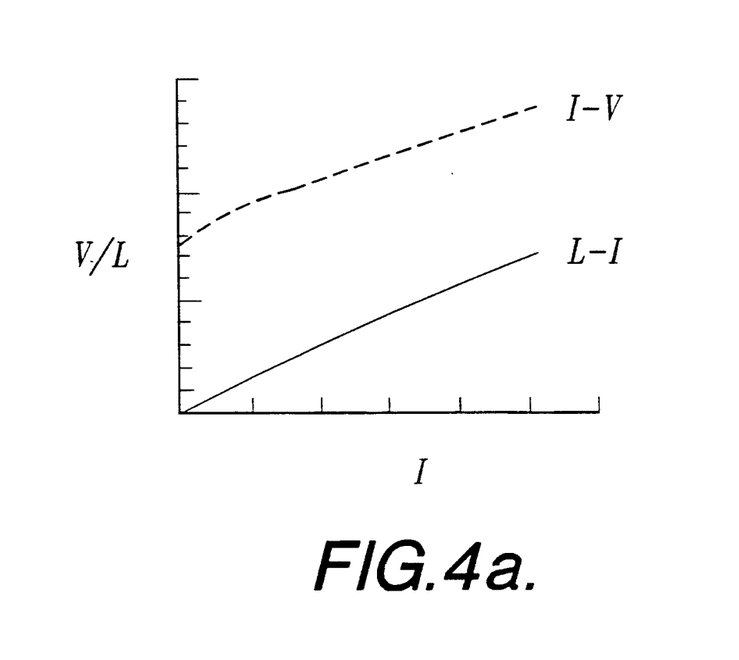
FIGS. 4a–4d are graphs similar to those of FIGS. 3a–3d, for pumped/unpumped lengths of 100/200 microns.
Figure 4B:
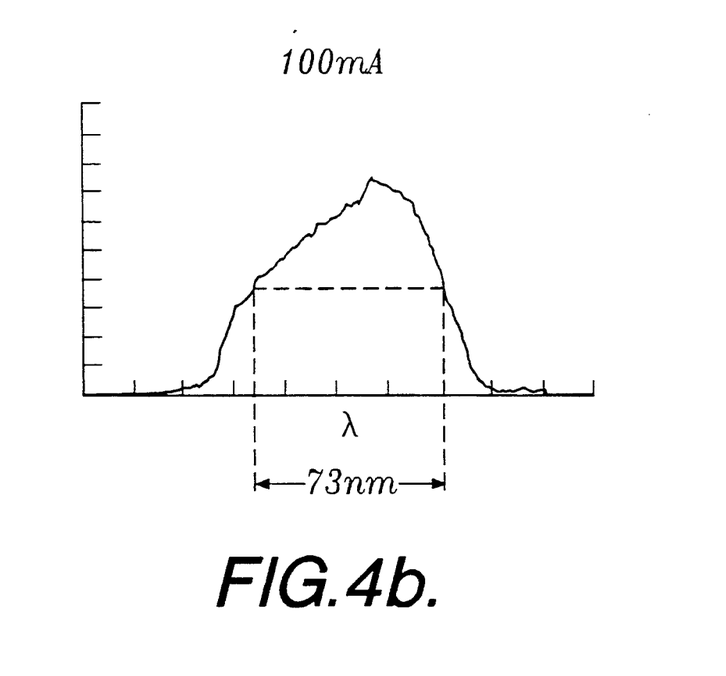
Figure 4C:
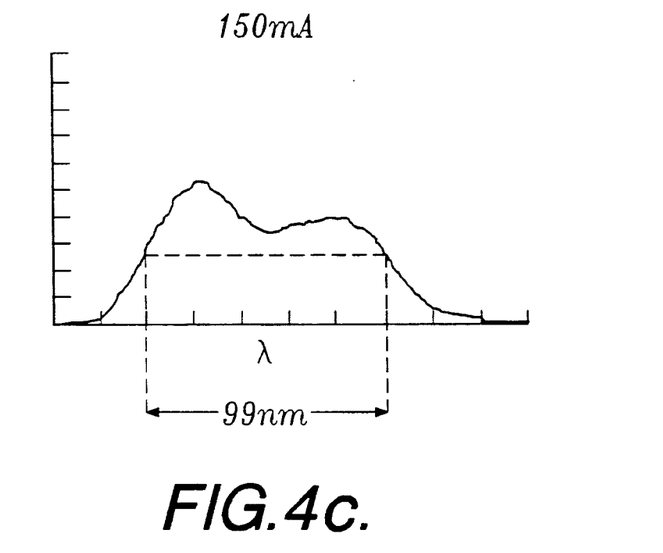
Figure 4D:
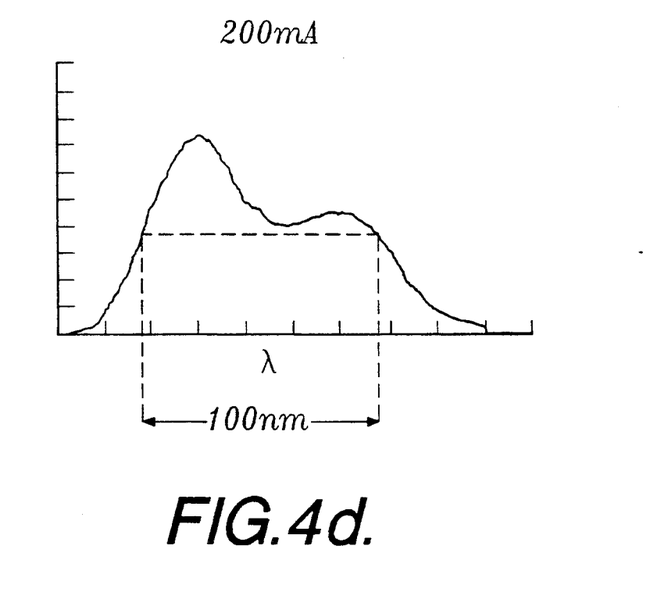

FIGS. 4a-4d illustrate results for an LED having a total length L of 300 microns, and a pumped length l of 100 microns. In FIG. 4a, it can be seen that the L-I curve has become more linear. The spectral characteristics of this LED are shown in FIGS. 4b-4d, the FWHM values being 73, 99, and 100 microns, respectively. Comparing FIGS. 3 and 4, it can be seen that as the ratio of the pumped cavity length l to the total cavity length L increases, the bandwidth begins to fall off. In addition, at low current levels (FIG. 4b), the double peaked shape of the spectrum disappears, and significantly more variation in the spectral shape can be seen for different current densities. As explained below, these characteristics indicate that the properties of this LED are becoming less desirable, particularly with respect to the production of a stable emission spectrum over temperature. Nevertheless, the bandwidth of this device is significantly higher than the 30 nanometers that is common for conventional LEDs.

Figure 5A:
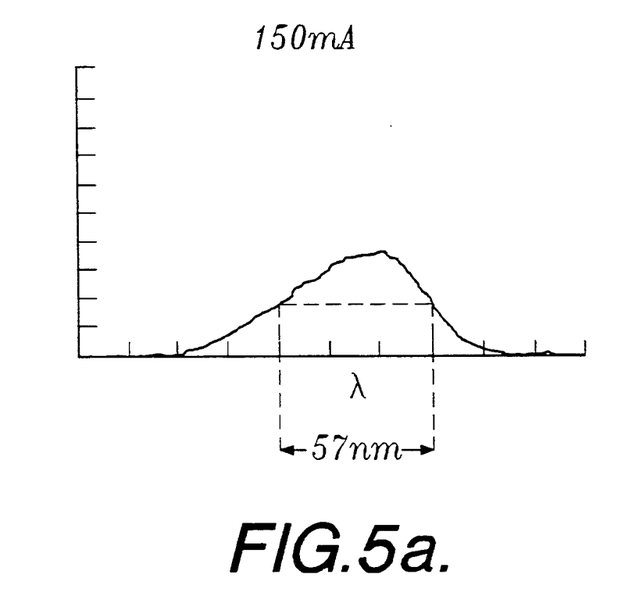
FIGS. 5a–5d are graphs similar to those of FIGS. 3a–3d, for pumped/unpumped lengths of 400/0 microns.
Figure 5B:
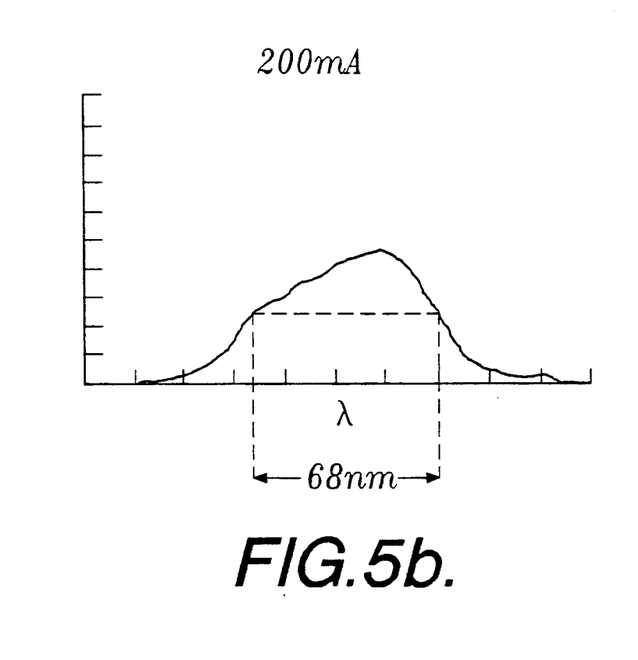
Figure 5C:
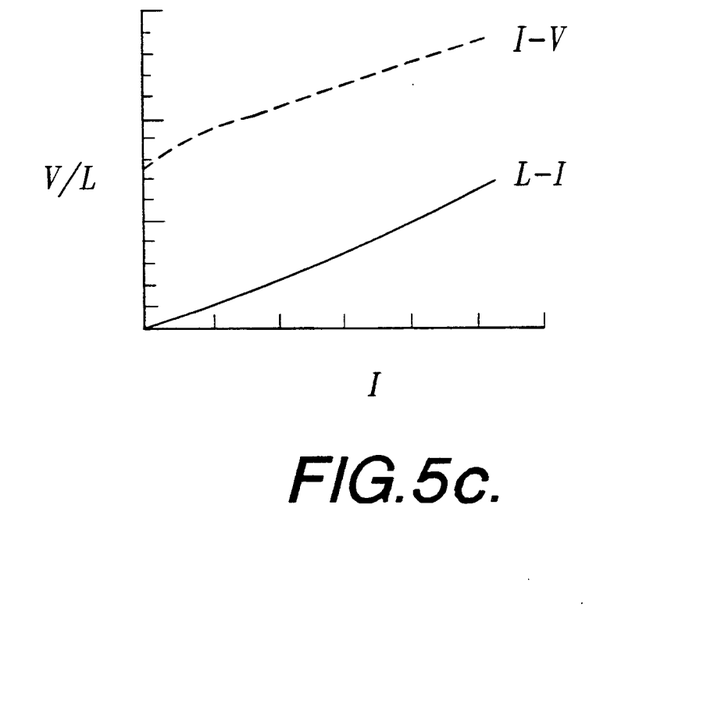
Figure 5D:
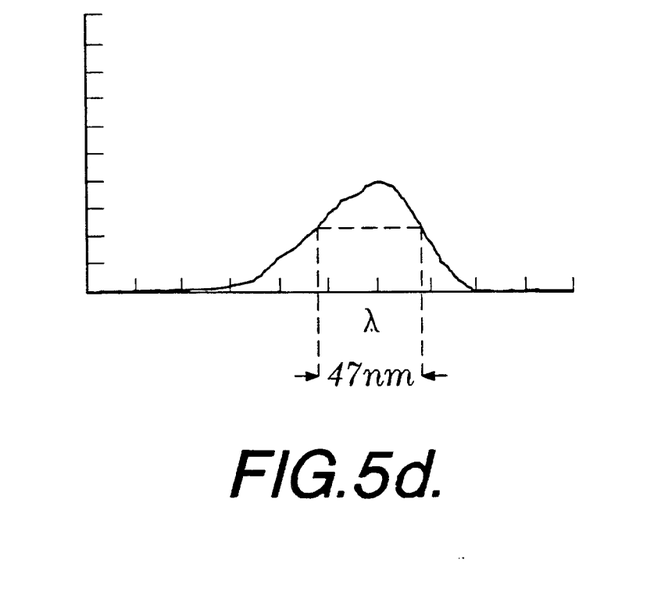

FIGS. 5a-5d show similar data for an LED having a cavity length L of 400 microns, in which the upper electrode's stripe extended the full cavity length, such that the pump length l was equal to the cavity length L. In FIG. 5a, it can be seen that the L-I curve has begun to bow upward, indicating that this device is operating essentially as a superluminescent diode. The FWHM value shown in FIGS. 5b-5d are 47, 57, and 68 nanometers, respectively. It may also be seen that the double peaked structure of the spectra has now disappeared at all indicated current levels. Such a device does not have the properties useful for producing a broadband LED with stable temperature characteristics, according to the present invention.

The spectral characteristics shown in FIGS. 3 and 4 are well suited for incorporation into a structure that includes two individually addressable active layers, each comprising multiple asymmetric quantum wells. With spectral bandwidths in the range of 100 nanometers per active layer, a two active layer structure will readily meet the 150 nanometer spectral range requirement for a WDM optical source. However, practical exploitation of this concept is hampered by the tendency for each active layer to have much higher gain for emission from one of its quantum wells, i.e., preferential pumping of one quantum well.

It is possible to achieve similar gain levels for two different quantum wells in a multiple asymmetric quantum well structure, by careful selection of the pumped and unpumped lengths. However, operation of such a system under balanced conditions will often be difficult to maintain, particularly if the device is required to operate over a wide temperature range, as is common in aerospace systems. In particular, dissimilar changes in individual quantum well gain, arising from temperature variation, will significantly disturb the gain balance between the two asymmetric quantum wells. This is a particular concern, for example, in commercial airplane applications, where operating temperature variations of 100° C. or more may be encountered. This problem is also of importance in applications which have small allowable variations in spectral power ripple.

To overcome the unbalanced emission problem, the present invention provides an LED structure having multiple cavities of differing pumped/unpumped lengths, or a single cavity with a variable pumped length. To simplify the discussion, this approach will be outlined for a single active layer device, with extensions to more complex structures discussed later.

Figure 6:
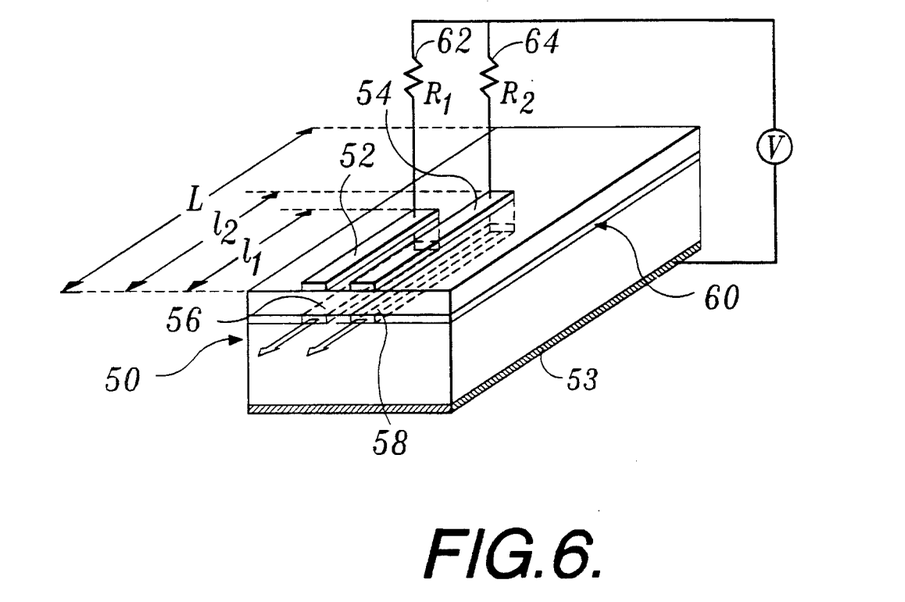
FIG. 6 is a schematic perspective view of a second preferred LED including a pair of side by side stripe electrodes of different lengths.
Figure 7A:
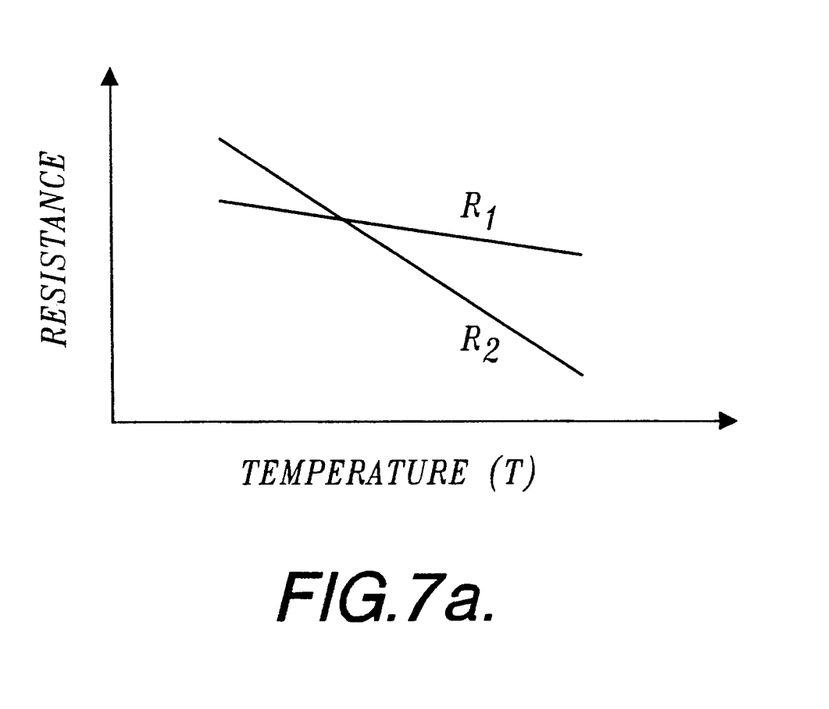
FIG. 7a is a graph showing the variation of resistance with temperature.

One preferred embodiment of the multiple cavity length LED is illustrated in FIG. 6. The illustrated LED includes a layered semiconductor structure 50 that may be generally similar to that shown in FIG. 1, structure 50 including active layer 60. The upper surface of structure 50 includes a pair of stripe electrodes 52 and 54 of different lengths $l_1$ and $l_2$, respectively, the total length of structure 50 once again being designated by L. The lower surface of structure 50 includes base electrode 53. The result is the creation of two cavities having pumped regions 56 and 58, respectively, in active layer 60. Because of the differing lengths of electrodes 52 and 54, the lengths of pumped regions 56 and 58 differ from one another, such that the cavities have different net gain characteristics. Current for the cavity that includes pumped region 56 is provided from constant voltage source V via electrode 52 and resistor 62, while current for the cavity that includes pumped region 58 is supplied from source V via resistor 64 and electrode 54. Resistors 62 and 64 have resistance values $R_1$ and $R_2$ respectively that are functions of the operating temperature of the device. Thus the current used to pump each cavity can be varied as a function of temperature. Suitable variations of $R_1$ and $R_2$ with temperature are illustrated in FIG. 7a. As illustrated, both resistance values decrease with temperature at different slopes. Decreasing resistance with increasing temperature can readily be obtained by fabricating the resistive elements out of a semiconductor material.

The values of $l_1$ and $l_2$ are selected to promote predominant electron injection into one of the two cavities at each of the temperature extremes over which the device must operate. The cavity with the smaller pumped region will preferentially produce shorter wavelength illumination, while longer wavelength emission will be preferentially produced from the cavity having the longer pumped region. By control of the individual cavity currents as a function of temperature, the combined emission from both cavities will yield minimum spectral power ripple over the required spectral range. Resistors 62 and 64 may be part of an external control circuit for controlling operation of the LED. Alternately, the temperature-dependent resistance elements may be integrated onto the surface of semiconductor structure 50.

While the structure shown in FIG. 6 is but one of many possible geometric approaches for producing two cavities having differing gain characteristics, there are substantial device processing advantages favoring the FIG. 6 approach, in which the overall length L is the same for both cavities.

Figure 7B:
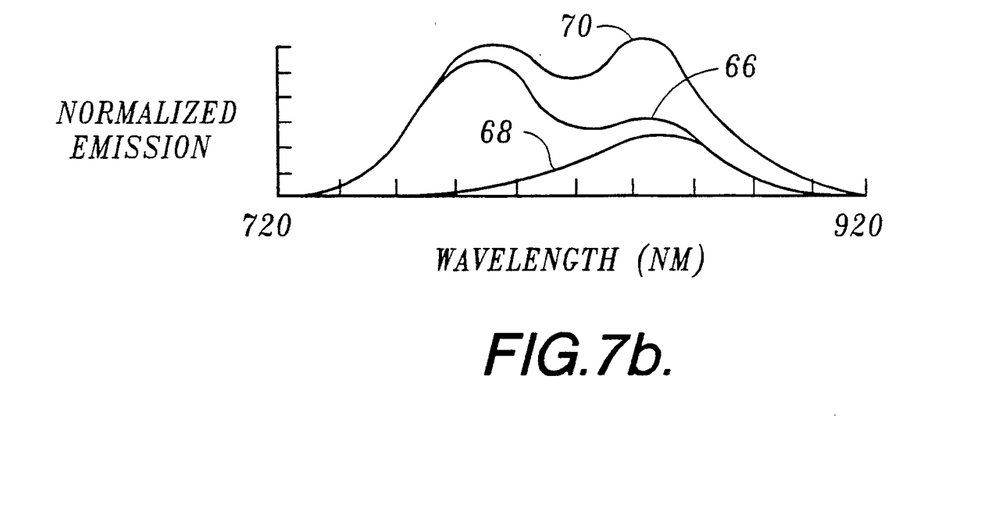
FIGS. 7b and 7c are graphs showing the simulated separate and composite spectra for the device of FIG. 6 at two different temperatures.
Figure 7C:
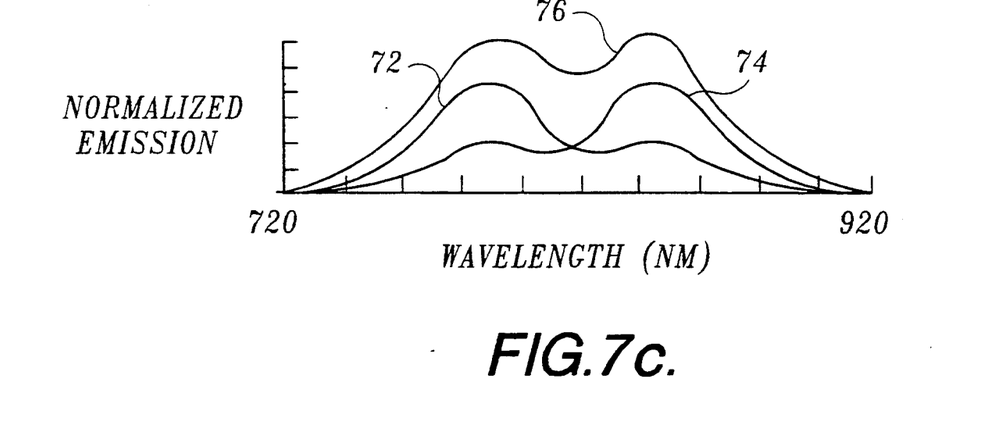

The temperature compensation approach is schematically illustrated in FIGS. 7b and 7c. These figures present the simulated behavior for an LED such as the one shown in FIG. 6, with the active layer having the multiple, asymmetric quantum well structure shown in FIG. 2. FIG. 7b represents high temperature operation, and FIG. 7c represents low temperature operation. Referring to FIG. 7b, curve 66 represents the emission produced by the cavity having pumped region 56, curve 68 represents the emission produced by the cavity having pumped region 58, while curve 70 represents the combined emission from both cavities. The emission indicated by curve 66 includes a peak at a relatively short wavelength, while the emission indicated by curve 68 includes a peak at a relatively long wavelength. The resulting composite emission spectrum 70 includes a broad double peak that spans over 100 nanometers of spectral width.

In FIG. 7c, it can be seen that at low temperature, the emission of the cavity that includes pumped region 56 is reduced somewhat, as indicated by curve 72, while the emission of the cavity that includes pumped region 58 is increased, as indicated by curve 74. The combined emission, indicated by curve 76, is very similar to the combined emission curve 70 produced at high temperature. At high temperatures, and higher electron mobilities, the current will be injected preferentially into the shorter pumped cavities. Alternatively, at low temperatures, the opposite current distribution applies, with preferential current injection into the longer pumped cavities. Extension of these concepts to produce broader peaks can be achieved by incorporating additional quantum wells into a single active layer structure.

Figure 8:
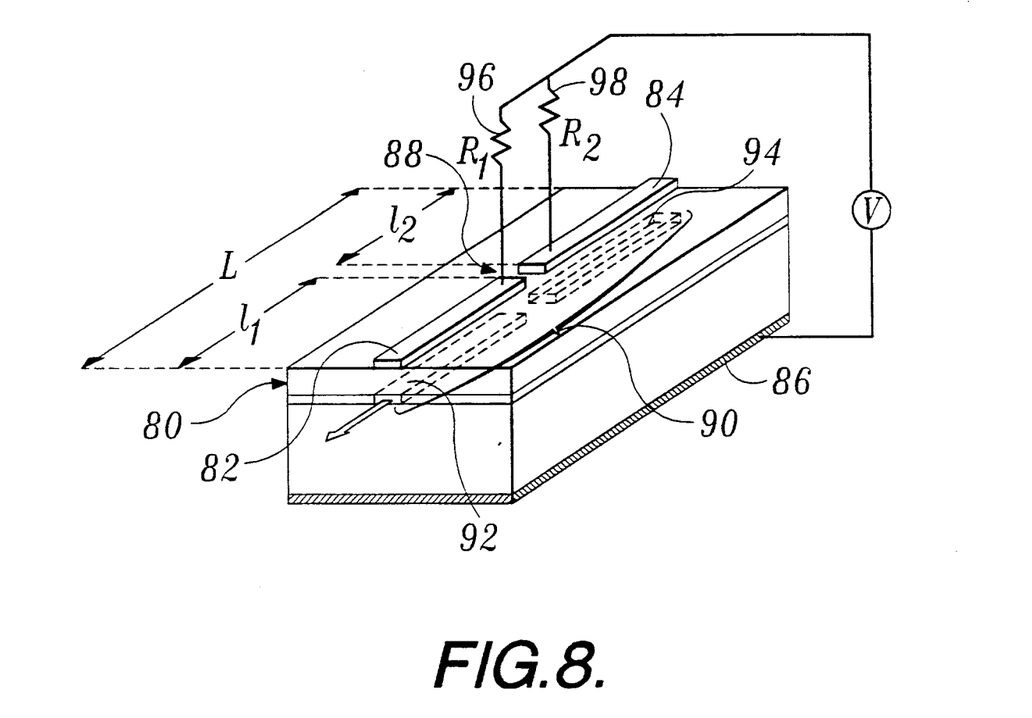
FIG. 8 is a schematic perspective view of a third preferred embodiment of the LED of the present invention.

A second prefered embodiment of the temperature compensation feature of the present invention is shown in FIG. 8. This embodiment includes semiconductor structure 80 that includes stripe electrodes 82 and 84 on its upper surface, and base electrode 86 on its lower surface. Electrodes 82 and 84 are colinear, and include gap 88 between them. In combination, the electrodes produce emission from cavity 90 that includes pumped region 92 produced by electrode 82, and pumped region 94 produced by electrode 84. The currents to the respective electrodes are controlled by temperature sensitive resistive elements 96 and 98 having resistance values $R_1$ and $R_2$, respectively. The resistive elements operate in a manner similar to that of FIG. 7a, to adjust the current as a function of temperature such that broadband emission is produced over a wide temperature range. The technique shown in FIG. 8 can readily be extended to provide more than two aligned electrodes on the upper surface of structure 80, each supplied from a temperature sensitive current source, to provide a further measure of control over the spectrum as a function of temperature. In addition, the techniques of FIGS. 6 and 8 can be combined, into a device with two or more cavities, at least some cavities being formed by two or more aligned electrodes.

Figure 9:
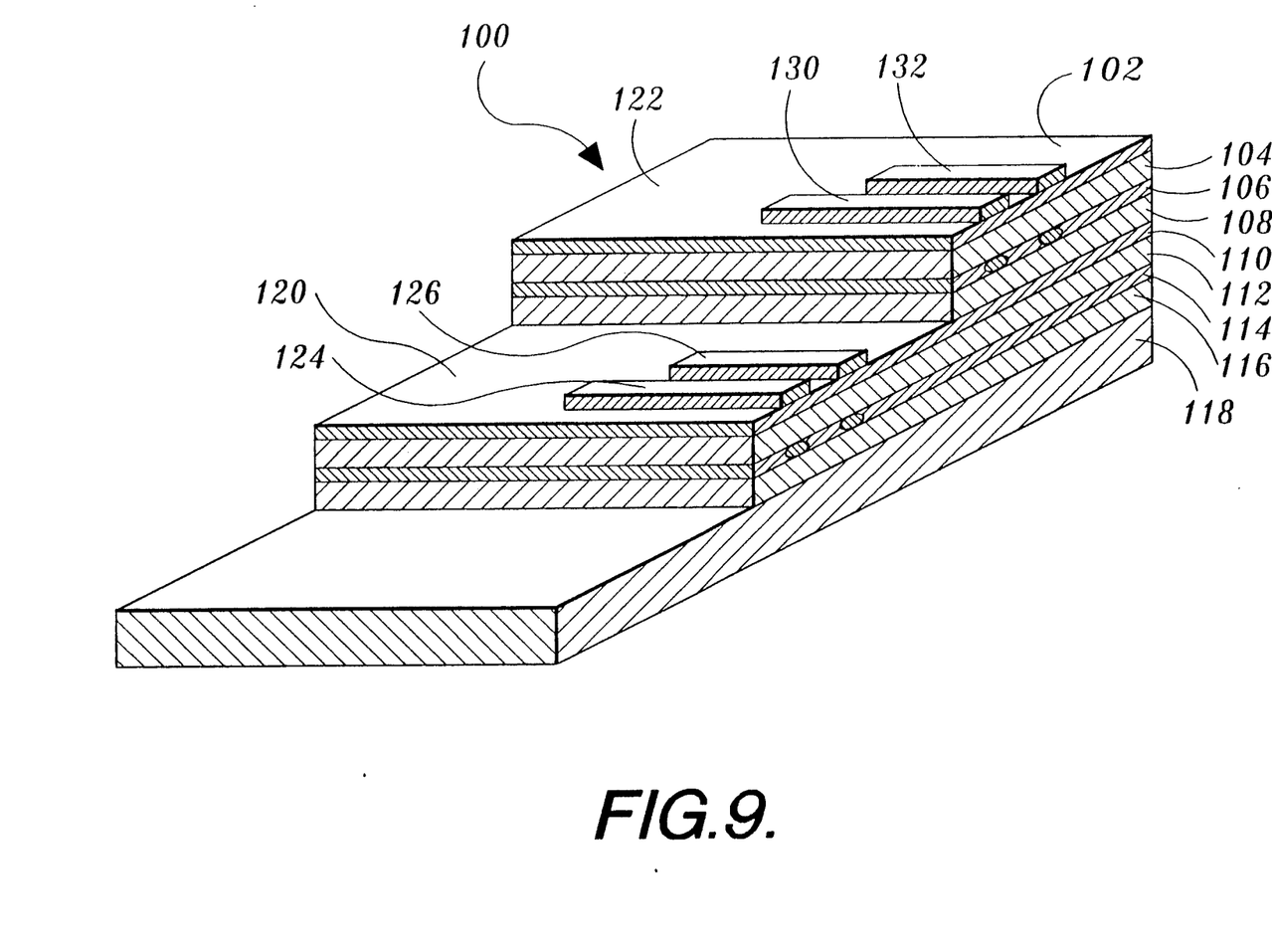
FIG. 9 is a schematic perspective view of a two-active layer, individually addressable LED structure, suitable for use as a broadband source in a wavelength division multiplexed system.

FIG. 9 depicts an extension of the approach shown in FIG. 6, into an LED having two individually addressable active layers. The LED includes semiconductor structure 100 comprising cap layer 102, cladding layers 104, 108, 112, and 116, active layers 106 and 114, contact layer 110, and substrate layer 118. To simplify the illustration, the GRINSCH or other confinement layers surrounding each active layer are not shown in FIG. 9. In a gallium arsenide system, the compositions of the illustrated layers may be as shown in Table 2 below.

TABLE 2

| p + GaAs | Cap (102) |
|---|---|
| p AlGaAs | Cladding (104) |
| GaAs | Active (106) |
| n AlGaAs | Cladding (108) |
| n GaAs | Contact (110) |
| n AlGaAs | Cladding (112) |
| GaAs | Active (114) |
| p AlGaAs | Cladding (116) |
| p + GaAs | Substrate (118) |

The indicated stair step arrangement of the layers in the width dimension produces upper surface 120 that can be used to drive active layer 114, and upper surface 122 that can be used to drive active layer 106. A pair of different length electrodes 124, 126 are deposited on surface 120, and a second pair of different length electrodes 130, 132 are deposited on surface 122. Each pair of electrodes is controlled by a temperature sensitive control circuit, such as the one shown in FIG. 6, to produce balanced operation over an extended temperature range. As described above, each pair of cavities can be designed to produce emission over a range of 100 nanometers or more, and the pair of active layers can therefore be designed to cover the 150 nanometer range required for a broadband source for a wavelength division multiplexed system.

Figure 10:
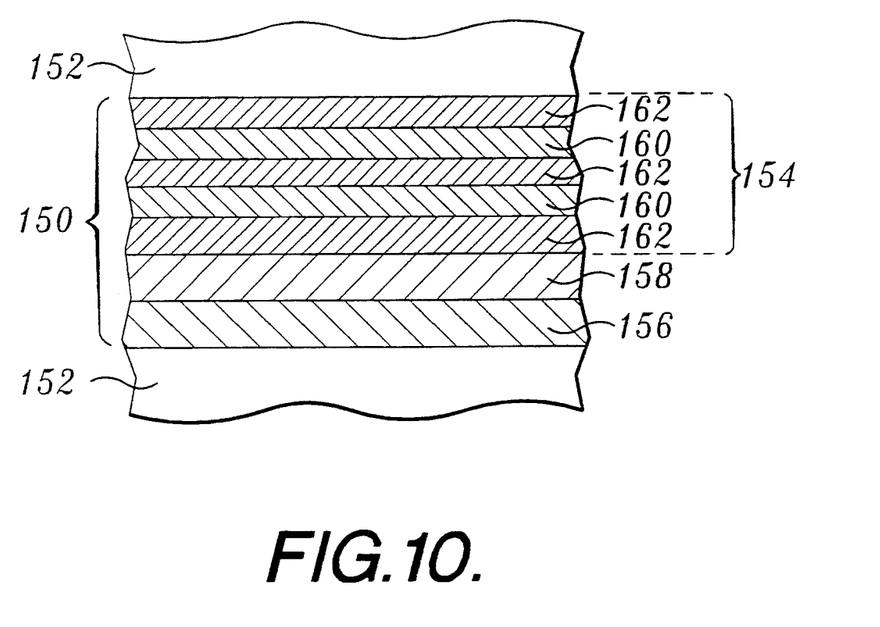
FIG. 10 shows a further preferred embodiment for the epitaxial structure of the active layer.

When the LED of the present invention is implemented using indium gallium arsenide (InGaAs) as the semiconductor material for the active layers, there may be applications in which the desired thickness for the quantum well layer cannot be obtained, because of lattice mismatches at the boundaries between layers. In such a case, it may be desirable to form an active layer as diagrammed in FIG. 10. FIG. 10 illustrates active layer 150 formed between a pair of confinement layers 152. Active layer 150 comprises upper quantum well structure 154 and lower quantum well 156 separated from one another by a first barrier layer 158. With upper quantum well structure 154 replaced by a single quantum well layer, this design would be similar to that shown in FIG. 2. However, in the FIG. 10 arrangement, upper quantum well structure 154 comprises a pair of quantum wells 160 separated from one another and from adjacent layers by second barrier layers 162. Quantum well layers 160 are fabricated from indium gallium arsenide, and second barrier layers 162 may be fabricated from gallium arsenide, because gallium arsenide has a higher band gap than indium gallium arsenide, and it can therefore be used to form a confinement layer for indium gallium arsenide. By breaking up what would have been a single relatively thick quantum well layer into a pair of relatively thinner quantum well layers, the quantum well layers may be made pseudomorphic, so that they can be incorporated into the structure without introducing lattice mismatch problems.

Although the embodiments described above have all involved active layers having multiple asymmetric quantum wells, single quantum well active layers can also be used for some applications. In a single quantum well active layer, it will generally be found necessary to adjust the current density through the active layer such that both the $n=1$ and $n=2$ quantum levels are pumped, to achieve the desired temperature stability.

While the preferred embodiments of the invention have been described, variations will be apparent to those skilled in the art. Accordingly, the scope of the invention is to be determined by reference to the following claims.

The embodiments of the invention in which an exclusive property or privilege is claimed are defined as follows:

1. A light-emitting diode (LED) having a broad spectral emission, the LED comprising:
   a layered semiconductor structure of length L including an active layer comprising first and second quantum wells separated from one another by a barrier layer, the quantum wells having band gap energies that differ from one another, the active layer being characterized by a confinement factor;
   a stripe electrode of length less than L formed on a first surface of the semiconductor structure, and a base electrode formed on a second, opposite surface of the semiconductor structure, the electrodes forming at least one optical cavity of length L in the active layer, the optical cavity having a pumped region of length l less than L; and
   the length l of the pumped region and the confinement factor being selected such that the LED operates below a lasing threshold.

2. The LED of claim 1, wherein the first surface of the semiconductor structure includes first and second stripe electrodes parallel to one another, the first and second electrodes having lengths $l_1$ and $l_2$, respectively, lengths $l_1$ and $l_2$ each being less than L.

3. The LED of claim 2, wherein the first and second electrodes are positioned side by side to form first and second optical cavities, respectively, each optical cavity having a total length L, and the first and second optical cavities having pumped lengths of $l_1$ and $l_2$, respectively.

4. The LED of claim 3, further comprising a control circuit for providing currents to the first and second electrodes, and for adjusting said currents as a function of temperature such that a combined light output from the first and second cavities has a broad emission spectrum over an operating temperature range.

5. The LED of claim 4, wherein the control circuit comprises first and second temperature sensitive resistance elements electrically coupled to the first and second electrodes, respectively.

6. The LED of claim 5, wherein each of the temperature sensitive resistance elements comprises a semiconductor material formed on the first surface.

7. The LED of claim 2, wherein the first and second electrodes are colinear, and combine to form the optical cavity of length L.

8. The LED of claim 7, further comprising a control circuit for providing currents to the first and second electrodes, and for adjusting said currents as a function of temperature such that the light output from the cavity has a broad emission spectrum over an operating temperature range.

9. The LED of claim 8, wherein the control circuit comprises first and second temperature sensitive resistance elements electrically coupled to the first and second electrodes, respectively.

10. The LED of claim 9, wherein each of the temperature sensitive resistance elements comprises a semiconductor material formed on the first surface.

11. A light-emitting diode (LED) having a broad spectral emission, the LED comprising:
    a layered semiconductor structure of length L including an active layer comprising a quantum well, the active layer being characterized by a confinement factor;
    first and second stripe electrodes formed on a first surface of a semiconductor structure, each electrode having a length less than L, and a base electrode formed on a second, opposite surface of the semiconductor structure, the stripe electrodes being parallel to one another and forming at least one optical cavity of length L in the active layer, the optical cavity having a pumped region of length l less than L; and
    the length l of the pumped region and the confinement factor being selected such that the LED operates below a lasing threshold.

12. The LED of claim 11, wherein the first and second electrodes are positioned side by side to form first and second optical cavities, respectively, each optical cavity having a total length L, the first and second optical cavities having pumped lengths of $l_1$ and $l_2$, respectively.

13. The LED of claim 12, further comprising a control circuit for providing currents to the first and second electrodes, and for adjusting said currents as a function of temperature such that a combined light output from the first and second cavities has a broad emission spectrum over an operating temperature range.

14. The LED of claim 11, wherein the first and second electrodes are colinear, and combined to form the optical cavity of length L.

15. The LED of claim 14, further comprising a control circuit for providing currents to the first and second electrodes, and for adjusting said currents as a function of temperature such that the light output from the cavity has a broad emission spectrum over an operating temperature range.

16. A light-emitting diode (LED) having a broad spectral emission, the LED comprising:
    a layered semiconductor structure of length L including first and second active layers, each active layer comprising a quantum well, the active layers being characterized by first and second confinement factors, respectively, the semiconductor structure further including a contact layer between the active layers and extending laterally beyond the first active layer;
    a pair of first stripe electrodes each of length less than L formed on a first surface of the semiconductor structure, a pair of second stripe electrodes each of length less than L formed on the contact layer, and a base electrode formed on a second surface of the semiconductor structure opposite to the first surface, the first stripe electrodes being parallel to one another and forming at least one first optical cavity of length L in the first active layer, the first optical cavity having a pumped region of length less than L, the second stripe electrodes being parallel to one another and forming at least one second optical cavity of length L in the second active layer, the second optical cavity having a pumped region of length less than L;
    the lengths of the pumped regions and the confinement factors being selected such that the LED operates below a lasing threshold.

17. The LED of claim 16, wherein the first stripe electrodes are positioned side by side to form a pair of respective first optical cavities in the first active layer, and wherein the second stripe electrodes are also positioned side by side to form a pair of respective second optical cavities in the second active layer.

18. The LED of claim 17, further comprising a control circuit for providing currents to the first and second stripe electrodes, and for adjusting said currents as a function of temperature such that a combined light output from the first and second cavities has a broad emission spectrum over an operating temperature range.

19. The LED of claim 16, wherein the stripe electrodes of each pair are colinear, and combine to form a single optical cavity of length L in the respective active layer.

20. The LED of claim 19, further comprising a control circuit for providing currents to the first and second stripe electrodes, and for adjusting said currents as a function of temperature such that a combined light output from the first and second cavities has a broad emission spectrum over an operating temperature range.

* * * * *

UNITED STATES PATENT AND TRADEMARK OFFICE
CERTIFICATE OF CORRECTION

PATENT NO. : 5,126,803
DATED : June 30, 1992
INVENTOR(S) : H.E. Hager et al.

It is certified that error appears in the above-identified patent and that said Letters Patent is hereby corrected as shown below:

| COLUMN | LINE | ERROR |
|---|---|---|
| [56] | "Attorney..." | "Christensin" should be --Christensen-- |
| 4 | 10 | "FIGS. 3b-3d," should be --FIGS. 3b-3d--. |
| 6 | 40 | "prefered" should be --preferred-- |
| [56] | 4th Reference | "S. Ideda et al." should be --S. Ikeda et al.-- |
| [56] | 5th Reference | "pp. 989" should be --pp. 988-992-- |

Signed and Sealed this

Twenty-fourth Day of August, 1993

Attest:

BRUCE LEHMAN

*Attesting Officer*  *Commissioner of Patents and Trademarks*